United States Patent [19]

Gear et al.

[11] Patent Number: 4,672,271
[45] Date of Patent: Jun. 9, 1987

[54] APPARATUS AND METHOD FOR AUTOMATIC OPERATION OF A HIGH PRESSURE MERCURY ARC LAMP

[75] Inventors: Gary Gear, Tempe; Steven S. Wiseman, Mesa, both of Ariz.

[73] Assignee: Omniprise, Inc., Mesa, Ariz.

[21] Appl. No.: 723,219

[22] Filed: Apr. 15, 1985

[51] Int. Cl.$^4$ .......................... H01J 7/24; H01J 17/28; H01J 61/52

[52] U.S. Cl. ..................................... 315/117; 315/112; 315/156; 315/157; 338/22 R

[58] Field of Search ................. 315/117, 112, 50, 156, 315/158, 159; 338/20, 22 R

[56] References Cited

U.S. PATENT DOCUMENTS

| | | | |
|---|---|---|---|
| 2,279,941 | 3/1942 | Dunham et al. | 315/117 |
| 3,467,937 | 9/1969 | Norton | 338/219 |
| 4,283,658 | 8/1981 | Parker | 315/117 |
| 4,312,224 | 1/1982 | Domen | 374/31 |

Primary Examiner—David K. Moore
Assistant Examiner—Theodore Salindong
Attorney, Agent, or Firm—Harry M. Weiss & Associates

[57] ABSTRACT

Apparatus and method for automatic control of with a high pressure mercury arc lamp is described. The apparatus includes a control unit that monitors the current and the voltage supplied to the arc lamp. A temperature measuring device is coupled to a portion of the lamp for monitoring the temperature. The control device controls a flow of air past the lamp by controlling the power to a fan motor or by controlling the flow of air by controllable dampers. After equilibrium conditions are established, the control unit determines and stores the equilibrium values of current and voltage. Thereafter the control unit monitors the values of current and voltage periodically. When these measured voltage and current values are outside of predetermined limits, the control unit initiates shut down operation of the lamp.

17 Claims, 4 Drawing Figures

APPARATUS AND METHOD FOR AUTOMATIC OPERATION OF A HIGH PRESSURE MERCURY ARC LAMP

BACKGROUND OF THE INVENTION

1. Field of the Invention

This invention relates generally to the operation of high pressure mercury arc lamps and, more particularly, to apparatus and method for operation of arc lamps that increases the stability and lifetime of the lamps and, in addition, can provide an indication the impending catastrophic failure of the mercury arc lamp.

2. Discussion of the Related Art

The need for high intensity light sources in various manufacturing processes has led to the increasing use of high pressure mercury arc lamps. Recently, the wafer stepper activity of the semiconductor industry has required the use of high intensity lamps operating for extended periods of time. Because lamp failure can cause a significant decrease in productivity, resulting from down times and repair of apparatus compromised by an arc lamp failure, and because fluctuations in the lamp operating characteristics are detrimental to the quality of the production process, efforts have been made to stabilize the operation of the lamp. Productivity can frequently be improved in the manufacturing process by higher intensity light sources, and high pressure mercury arc lamps with higher power ratings, have been placed in extended use, for example, in the processing of semiconductor wafers. The lamps with higher power ratings have produced additional control problems.

A flow of cooling air has typically been provided to the lamp for stabilization of the temperature in a temperature region where high arc lamp efficiency has been established. The typical manner of calibration of the flow of air has, in the past, been to insert a temperature sensing element in contact with one of the electrodes, to initiate a lamp arc, and to determine experimentally where the fan controlling the flow of air produces the recommended operating temperature of the arc lamp. Once this parameter is established, the temperature measuring device is removed and the optimum characteristic of operation of the cooling fan is considered to be established for the remainder of the life of the bulb. This procedure has two problems. First, it is typical to initiate operation of the lamp simultaneously with the initiation of the flow of cooling air past the lamp. The flow of air thus lengthens the time which is required by the lamp to reach equilibrium operating conditions. In some instances, the arc lamp may never reach the recommended operating conditions. This situation is especially common when an attempt is made to prolong arc lamp life by operating the lamp under reduced temperature or power conditions. Second, this technique does not take into account that fluctuations exist in line voltages, in operating characteristics of the lamp, and in the ambient atmospheric conditions. The flow of air, for example, can frequently be affected by opening of a door to the room containing the arc lamp, by unnoticed obstacles in that air flow paths as well as other similar conditions.

In previous arc lamp installations, control of characteristics such as temperature, voltage and current was performed manually. The manual control of the characteristics of the mercury arc lamp can require the services of the technician and has proven to be an ineffective method to improve performance of the lamp.

When a lamp fails, it is frequently through a catastrophic event, such as an explosion. Not only are the associated manufacturing processing interrupted, but the disturbance resulting from the explosion, can require extensive repair and maintenance. A desirable feature of any apparatus associated with a high pressure mercury arc lamp would be the ability to warn of impending failure.

A need has therefore been felt for a method of control of the arc lamp that does not require the services of a technician, can stabilize the operating conditions of the arc lamp in a optimum manner, and can indicate when a lamp failure is imminent.

SUMMARY OF THE INVENTION

It is an object of the present invention to provide an improved apparatus and method for control of a high pressure mercury arc lamp.

It is another object of the present invention to provide apparatus for controlling and monitoring the flow of air past a mercury arc lamp.

It is a more particular object of the present invention to provide apparatus for monitoring the voltage and current to a high pressure mercury arc lamp and to indicate an imminent lamp failure when predetermined voltage and current parameters are exceeded.

It is yet another particular object of the present invention to initiate operation of a mercury arc lamp, permit the lamp to reach an equilibrium condition, determine the parameters producing the equilibrium conditions, and compare these equilibrium parameters for the remainder of the operating cycle.

It is still another particular object of the present invention to insert a temperature measuring device in contact with the mercury arc lamp and to use the signals derived from the temperature measuring device to control the flow of air past the mercury arc lamp.

The aforementioned and other objects are accomplished, according to the present invention, by a temperature measuring device in thermal contact with a mercury arc lamp. The temperature measuring device is continually monitored by a control unit. The control unit uses the output signals of the temperature measuring device to control the temperature of lamp by controlling the flow of air past the lamp. The flow of air past the arc lamp can be controlled by the power applied to a fan or by the position of dampers at either an input and/or output air ports for the flowing air. Thus, the arc lamp temperature is continually monitored and the desired operating temperature can be maintained. In addition, the control unit monitors the current and the voltage from the power supply to the lamp. During lamp start up, the lamp is not cooled by the flow of air until the power applied to the lamp has caused the warming of the lamp to a predetermined temperature. At this point, the cooling mechanism is initiated, and the feedback control of the arc lamp temperature activated. At the same time, the current and voltage values are monitored and theses values are tracked by the control unit. After a predetermined period of time, the voltage and current values are considered to have achieved steady state or equilibrium operating conditions for the lamp at the optimum temperature, and the equilibrium values of voltage and current are stored in a memory location for future reference. After the predetermined period of time, any excursions of either the current value or the voltage value from the stored steady state values by predetermined quantitied is interpreted as a sign of imminent lamp failure and the operation of the lamp is terminated by the control unit.

These and other features of the present invention will be understood upon reading of the following description along with the drawings.

DESCRIPTION OF THE PREFERRED EMBODIMENT

Detailed Description of the Figures

Figure 1:
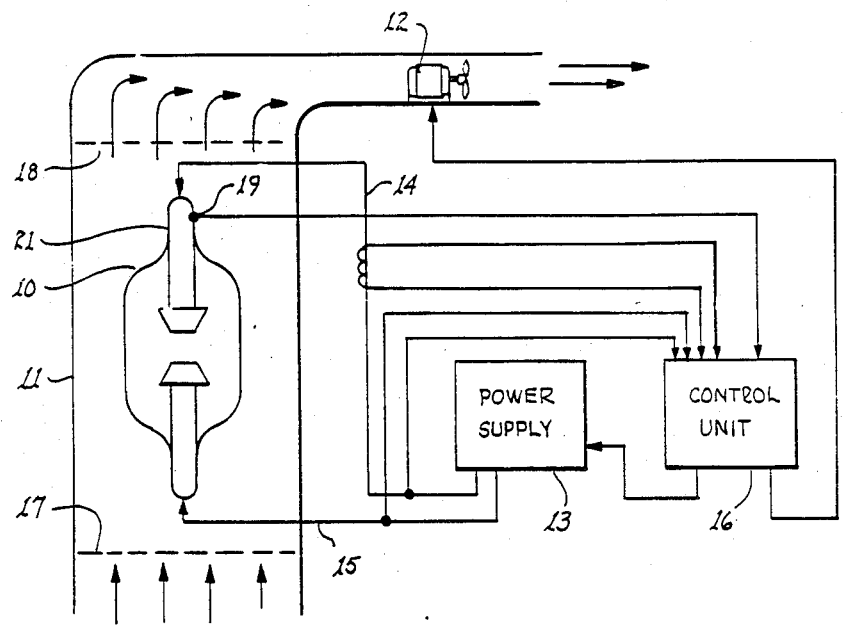
FIG. 1 is a block drawing of a high pressure mercury lamp and the associated apparatus used to control the lamp.

Referring first to FIG. 1, a high pressure mercury arc lamp 10 is enclosed in a chamber 11. The air enters the chamber through entrance port 17 and exits the chamber through exit port 18. Fan and motor 12 provides the mechanism that forces the air through the chamber 11. Additionally or alternatively, damping apparatus can control the effective size of the exit or entrance port and thereby can control the flow of air through the ports 17 and 18. The lamp has optical ports for extracting the desired high intensity radiation, but these ports are not part of the instant invention and are therefore not shown in this figure. The lamp 10 is coupled electrically to power supply 13 through conductors 15 and 14. Control unit 16 is coupled to conductors 14 and 15 of the power supply 13. Signals from conductors 14 and 15 provide signals related to the voltage value and current value being applied to the arc lamp. The control unit 16 also receives signals from temperature measuring device 19. The control unit can provide signals to the fan 12 (and/or to air channel dampers) and to the power supply 13.

Figure 2:
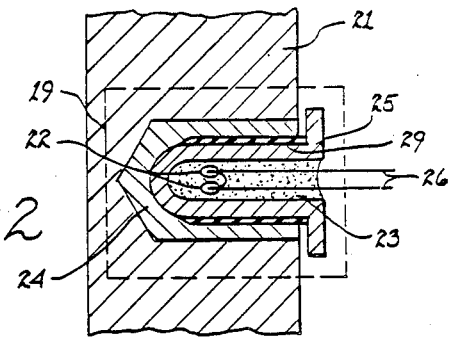
FIG. 2 is a schematic drawing of the thermistor configuration used to determine the temperature of the lamp according to the instant invention.

Referring next to FIG. 2, a cross-section view of the temperature monitoring equipment 19, according the present invention, is shown. A commercial temperature sensing device including two thermistor units 22 are embedding in an epoxy potting compound 23 and housed in an aluminum holder 25. A teflon sleeve 29 is applied over the holder 25. In the preferred embodiment, the sleeve can extend beyond the cylindrical curved portion of the housing. An aperture in the mounting nut 21 of the mercury arc lamp 10 receives the aluminum holder 25 and associated sleeve 29 and these elements are surrounded by an alumina compound 24. The alumina material 24 is applied around thermistor holder unit to increase the electrical isolation of the thermistor unit and to improve thermal coupling to the mounting nut 21. Leads 26 from the thermistor units provide signals corresponding to the mounting nut temperature to the control unit 16.

Figure 3:
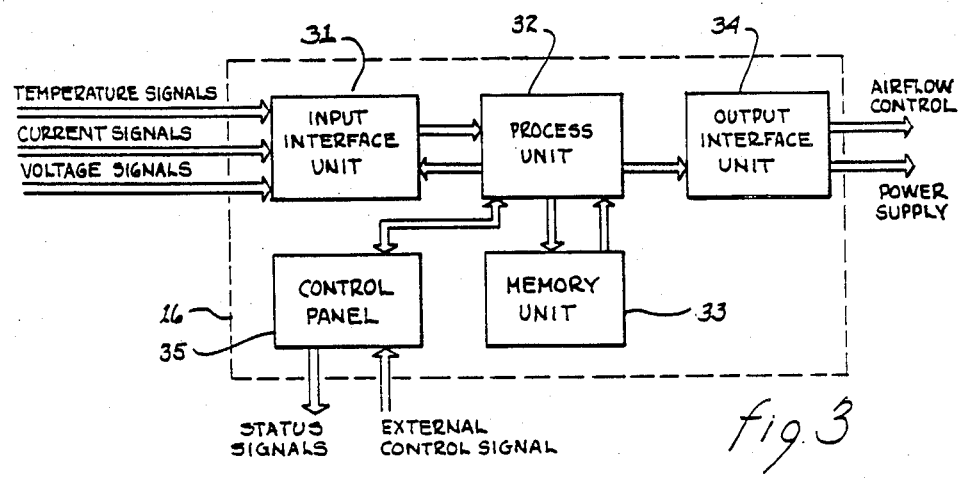
FIG. 3 is a block diagram of the control unit used in the instant invention.

Referring next to FIG. 3, a block diagram of control unit 16 is shown. An input interface unit 31 receives signals from the power supply 13 and from the temperature measuring device 19. The interface unit converts the analog signals provided by the apparatus into digital signals, a signal format for convenient manipulation by processing unit 32. Processing unit 32 has associated therewith a memory unit 33, which can store the control programs utilized by the processing unit. The memory unit can also store various values either generated by processing unit or needed by the processing unit to compare with the input signals as required by the program. Based on the algorithm of the memory unit 33 and the values placed therein, processing unit 32 applies signals to output interface unit 34 that are a function of the controller program and the input signals. Output interface unit 34 converts the digital signals manipulated by the processing unit 32 into signals suitable for control of the lamp cooling apparatus. Control panel 35 permits the application of signals from an external source to the processing unit for controlling operation and permits the display of conditions when desired by the operator. The control panel can also transfer the status signal to a remote location.

Figure 4:
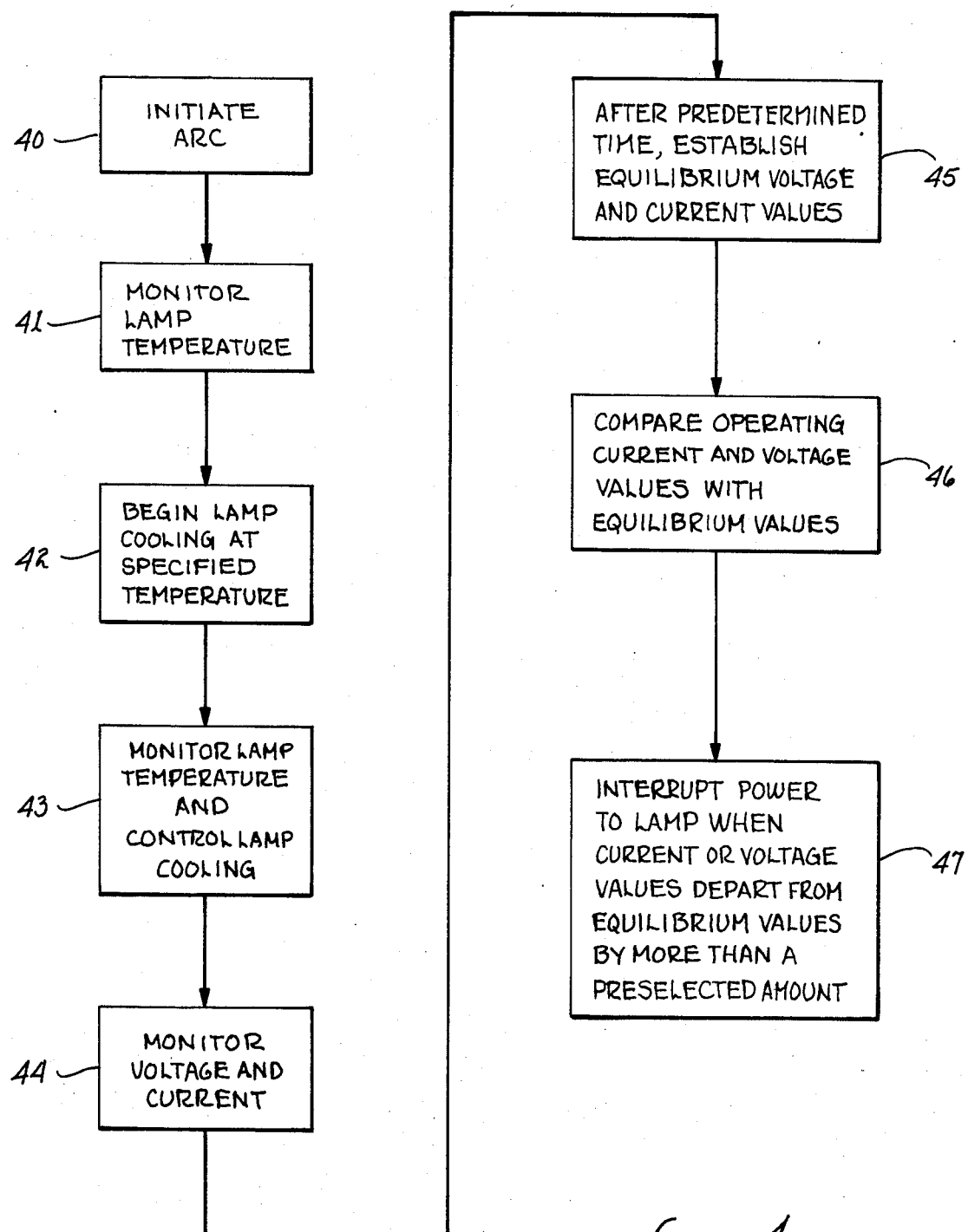
FIG. 4 is a flow diagram of the operation of the high pressure mercury arc lamp according the the present invention.

Referring next to FIG. 4, the process for controlling the operation of the lamp is shown. In step 40, the arc is ignited by an operator, for example, by application of a high voltage pulse. The temperature of the lamp is monitored, in step 41, until the temperature reaches a predetermined value 42. At this temperature the operation of the cooling apparatus begins. Thereafter, in step 43, and continuing until termination of the lamp operation, the output signals of the temperature measuring device are monitored, and, through the resulting feedback loop, control and stabilize the temperature of the lamp. In addition, the monitoring of the current and voltage value from the power supply is begun in step 44. In step 45, after a predetermined period of time for operation of lamp at equilibrium temperature, the steady state operating current and voltage values of the arc lamp are established. Using the steady state values determined by the monitoring apparatus, the current and voltage values are thereafter monitored with respect to predetermined limits based on the steady state values in step 46. When the current and/or voltage values fall outside of the predetermined limits, the lamp operation is terminated in step 47 and appropriate signals are communicated to record the reason for the operation termination.

Operation of the Preferred Embodiment

In the high pressure mercury arc lamps, a carrier gas, typically Argon, is placed in the lamp. When an arc is initiated in the lamp, the break down of Argon gas initially results in a lowering of the resistive value across the lamp and the flow of current through the lamp increases. In the preferred embodiment, the initiation of an arc is the result of a high voltage pulse to the lamp. To avoid damage to the processing unit of the control unit, the processing unit is placed in a reset mode during application of the high voltage pulse. After the processing unit leaves the reset mode, the procedures beginning at step 41 of FIG. 4 are initiated. As the flow of current, in conjunction with the applied voltage, through the lamp continues, a heating of the lamp occurs and liquid mercury within the lamp is vaporized. In order to achieve a relatively rapid approach to an equilibrium value, the lamp, according to the present invention, is not cooled immediately after initiation of the lamp operations. The cooling of the lamp begins only after a predetermined temperature is reached and, thereafter, a feedback loop is maintained as long as the lamp is in operation. The control of the fan and/or a controllable damper mechanism maintains the temperature at a predetermined level of the lamp, as determined by the temperature measuring device, by controlling the flow of air past the lamp. After the arc lamp has achieved an equilibrium conditiion with respect to temperature, the bulb temperature is monitored and when the temperature departs from the equilibrium temperature, the feedback control process initiates a response intended to return the lamp to the equilibrium temperatures as rapidly as possible. Some fluctuations in the voltage and current applied to the lamp can still occur. During a pre-established period of time, while the arc lamp is at the equilibrium temperature, the current and the voltage values are monitored and are processed in such a way as to determine asymptotically the equilibrium voltage and current values as the operating conditions stabilize. Under the equilibrium operating conditions, the current and the voltage values are found not to vary significantly for as long as the lamp is operating in the equilibrium mode for a period of time that can be measured in months of lamp operating time. When the departure from these equilibrium values exceeds pre-selected limits, this departure is interpreted as a sign of imminent lamp failure and the control unit acts to terminate arc lamp operation, for example, by shutting down the operation of the power supply. The control unit can also monitor the current in such a way that when the current is less than a predetermined value, it is assumed that the lamp has had a total breakdown and is no longer in the circuit. Again, power supply shutdown is undertaken.

The temperature measuring device, employed by the instant invention, includes a plurality of commercially available thermistor units inserted in a metal housing. The thermistor units are provided with significant electrical isolation and this isolation is further enhanced by a surrounding media of the housing, typically of alumina and teflon. The thermistor housing is inserted into the mounting nut of the lamp. The thermistor units have a non-linear characteristic that must be calibrated for the range of operating temperatures. This calibration is entered into the control unit and the temperature is automatically corrected for the nonlinearities prior to comparison with the equilibrium temperature.

With respect to the determination of an equilibrium temperature, the lamp manufacturers typically provide a desired temperature for operation of the bulb of the lamp. A calibration must therefore be performed that relates the bulb temperature recommended by the manufacturer to the mounting nut temperature (i.e. the temperature measured by the thermistors). This calibration is performed by physically coupling temperature measuring devices to the appropriate region of the lamp bulb and upon achieving of the equilibrium conditions recommended by the manufacturer. The temperature of the temperature measuring unit 19 in the mounting nut is determined for this equilibrium temperature.

The foregoing mechanism for operation of the present invention has been found to significantly extend the lifetime of the lamp for useful employment in manufacturing processing applications and can significantly stabilize the characteristics of the lamp. The stabilization of the lamp characteristics provides better quality control in manufacturing processing applications, particularly in the wafer stepper production.

The above description is included to illustrate the operation of the preferred embodiment and is not meant to limit the scope of the invention. The scope of the invention is to be limited only by the following claims. Many variations will be apparent to one skilled in the art that would yet be encompassed by the spirit and scope of the invention.

What is claimed is:

1. For use with a high pressure mercury arc lamp, control apparatus comprising:
   a temperature measuring device coupled to a lamp for measuring the temperature of said lamp;
   cooling mechanism for forcing air to flow by said lamp; and
   a control unit coupled to said temperature measuring device and to said cooling mechanism, said control unit measuring both voltage and current being supplied to said lamp, said control unit and said temperature measuring device forming a temperature feedback loop for said lamp.

2. The control apparatus of claim 1 wherein said cooling mechanism can be a fan apparatus, said control unit controlling power to said fan or controlling an effective aperture for air flowing past said lamp.

3. The arc lamp control apparatus of claim 1 wherein said control unit is coupled to a power supply supplying voltage and current to said arc lamp, said control unit providing a signal disabling said power supply when said voltage or current have one of a set of predetermined values.

4. The arc lamp control apparatus of claim 3 wherein said control unit maintains said lamp temperature for a preselected period of time, said control unit further comprising apparatus for establishing said predetermined values during said preselected period of time by measuring the voltage, current and temperature of said lamp.

5. The control apparatus of claim 1 wherein said temperature measuring device includes:
   a metallic housing unit adapted to be inserted in an aperture in an arc lamp mounting nut;
   a teflon sleeve generally enclosing said housing unit;
   at least one thermistor unit is said housing unit; and
   an insulation material securing said thermistor unit in said housing unit.

6. Apparatus for controlling the operation of a high pressure mercury arc lamp comprising:
   temperature measuring means coupled to a lamp;
   air flow means for controllably forcing air past said lamp; and
   current and voltage sensing means for sensing current and voltage applied to said lamp,
   control means coupled to said temperature measuring means, said current and voltage sensing means and said air flow means for controlling a temperature measured by said temperature measuring means by controlling said air flow means.

7. The apparatus of claim 6 wherein said control means further includes means for disabling said lamp when predetermined conditions are detected.

8. The apparatus of claim 7 wherein said control means includes means for measuring and storing equilibrium values of current and voltage, wherein said predetermined conditions are values different from said equilibrium values of a preestablished amount.

9. The apparatus of claim 6 further including means for initiating a flow of said forced air after said arc lamp temperature measuring means measures a pre-established temperature.

10. The apparatus of claim 5 wherein said cooling mechanism can be a fan means and an aperture control means.

11. The method of operating a high pressure mercury arc lamp comprising the steps of:
   coupling a temperature measuring device to a lamp;
   coupling an electrical power measuring device to said lamp;
   maintaining a temperature of said lamp at a predetermined value by using signals from said temperature measuring device and said power measuring device to control a cooling flow of air past said lamp.

12. The method of operating a high pressure mercury arc lamp of claim 11 further comprising the step of:
   determining an equilibrium values for current and for voltage applied to said lamp when said lamp is at said predetermined temperature value.

13. The method of operating a high pressure mercury arc lamp of claim 12 further comprising the step of:
   removing said lamp current and said lamp voltage when at least one of said lamp current and said lamp voltage differs for said determined equilibrium value by a pre-selected amount.

14. The method of operating a high pressure mercury arc lamp of claim 11 further comprising the step of:
   beginning said cooling flow of air after said lamp has reached a selected temperature.

15. The method of operating a high pressure mercury arc lamp of claim 12 further including the step of:
   monitoring said lamp voltage and said lamp current for a pre-established period of time; and
   using values from said monitoring step to determine the equilibrium values.

16. The method of operating a high pressure mercury arc lamp of claim 11 further including the step of calibrating said temperature measuring device when said lamp has achieved recommended operating conditions.

17. The method of operating a high pressure mercury arc lamp of claim 11 further including the step of mounting said temperature measuring device in a mounting nut of said lamp.

* * * * *